(12) United States Patent
Nagasaki

(10) Patent No.: US 7,498,676 B2
(45) Date of Patent: Mar. 3, 2009

(54) SEMICONDUCTOR DEVICE

(75) Inventor: Kenji Nagasaki, Tokyo (JP)

(73) Assignee: Oki Electric Industry, Co., Ltd., Tokyo (JP)

( * ) Notice: Subject to any disclaimer, the term of this patent is extended or adjusted under 35 U.S.C. 154(b) by 223 days.

(21) Appl. No.: 11/276,825

(22) Filed: Mar. 15, 2006

(65) Prior Publication Data
US 2006/0231942 A1 Oct. 19, 2006

(30) Foreign Application Priority Data
Apr. 15, 2005 (JP) .............................. 2005/117956

(51) Int. Cl.
*H01L 23/48* (2006.01)
*H01L 23/52* (2006.01)
(52) U.S. Cl. ................. 257/737; 257/774; 257/692; 257/E23.011
(58) Field of Classification Search ................. 257/737, 257/774, 692, E23.011
See application file for complete search history.

(56) References Cited

U.S. PATENT DOCUMENTS

| 6,020,217 | A  | * | 2/2000  | Kuisl et al. ................. 438/106 |
| 6,181,569 | B1 | * | 1/2001  | Chakravorty ................. 361/761 |
| 6,559,540 | B2 | * | 5/2003  | Kawashima ................. 257/737 |
| 6,960,829 | B2 | * | 11/2005 | Hogerl ........................ 257/737 |
| 6,975,035 | B2 | * | 12/2005 | Lee ............................. 257/778 |
| 2001/0026954 | A1 | * | 10/2001 | Takao ........................ 438/106 |
| 2003/0186487 | A1 | * | 10/2003 | Hogerl ........................ 438/132 |
| 2004/0212086 | A1 | * | 10/2004 | Dotta et al. ................. 257/737 |

FOREIGN PATENT DOCUMENTS

JP 2004/22699 A 1/2004

* cited by examiner

*Primary Examiner*—Nitin Parekh
(74) *Attorney, Agent, or Firm*—Rabin & Berdo, PC

(57) ABSTRACT

A semiconductor device includes a semiconductor substrate, an electrode pad, a wiring, a conductive post, an insulator, a sealing resin, and an external electrode. The electrode pad is formed on the main surface of the semiconductor substrate. The wiring is formed above the semiconductor substrate, the wiring electrically connecting with the electrode pad. The conductive post is formed on the upper surface of the wiring, the conductive post electrically connecting with the wiring. The insulator is formed on the lateral surfaces of the conductive post and has a thermosetting property. The sealing resin is formed over the semiconductor substrate and the wiring and on the surface of the insulator. The external electrode is formed on the conductive post, the external electrode electrically connecting with the conductive post.

7 Claims, 5 Drawing Sheets

SEMICONDUCTOR DEVICE

BACKGROUND OF THE INVENTION

1. Field of the Invention

The present invention relates to a semiconductor device, particularly to a chip-size packaged resin-sealed type semiconductor device. Moreover, the present invention also relates to a method of manufacturing such semiconductor device.

1. Background Information

In recent years, as portable devices typified by notebook PCs and cellular phones become rapidly popular, semiconductor devices to be mounted on such portable devices must become smaller, thinner and lighter. One key technology which realizes such needs is a high-density packaging technique, such as a CSP (chip size package) which is extremely close to the size of a semiconductor chip. Particularly, a W-CSP (Wafer Level Chip Size Package) technique, in which the sealing process is done in a wafer state, is considered to be an ultimate compact package, and it is drawing increasing attention because may provide advantages such as reduction in manufacturing costs.

A conventional semiconductor device manufactured by using the W-CSP technique has wirings connected to each of the electrode pads of a semiconductor chip, conductive posts connected to the wirings, a sealing resin covering the semiconductor chip at about the same level as the layer of the conductive posts, and external electrodes formed at the end of each of the conductive posts. In this connection, there is a LGA type, a BGA type, or the like, depending on the shape of the external electrode.

One example of a chip-size package type semiconductor device is shown in Japanese Laid-Open Patent Application No. 2000-22699 (hereinafter to be referred to as Patent Reference 1). The semiconductor device of Patent Reference 1 has wirings made of a copper material formed on a semiconductor substrate, columnar electrodes (i.e., conductive posts) made of a copper material formed on the wirings, and a sealing resin formed on the semiconductor substrate and the wirings, in a way that covers the lateral surfaces of the columnar electrodes. Copper oxide films are formed on the surfaces of the wirings and the lateral surfaces of the columnar electrodes.

In a conventional semiconductor device manufactured by using a typical W-CSP technique, a structure is adopted in which the sealing resin is directly adhered to the lateral surfaces of the conductive posts. However, the adhesiveness between the sealing resin and the conductive posts is not necessarily sufficient. When the adhesiveness between the sealing resin and the conductive posts becomes weak due to manufacturing error etc., the sealing resin may become easily separated from the lateral surfaces of the conductive posts, which results in the generation of gaps between the sealing resin and the conductive posts. When gaps are generated between the sealing resin and the conductive posts, there is a possibility, for instance, that moisture will enter inside the package through the gaps, which may result in the occurrence of corrosion on the elements made of a metal material, such as the conductive posts and the wirings. As for other possible problems which may be caused by having gaps between the sealing resin and the conductive posts, for instance, the conductive posts may be displaced due to external force, which may result in the generation of cracks in the insulation film etc. on the surface of the semiconductor chip.

Considering such possible problems, the semiconductor device disclosed in Patent Reference 1 has adhesive layers made of copper oxide formed on the lateral surfaces of the columnar electrodes (i.e., the conductive posts) in order to strengthen the adhesiveness between the sealing resin and the columnar electrodes, and make the sealing resin difficult to break away. However, forming a copper oxide film on the lateral surfaces of the columnar electrodes requires a large number of processes, such as a wet-etching process for making the surfaces of the columnar electrodes pure copper surfaces, a pre-baking process for making the substrate temperature uniform at a predetermined temperature, a main baking process for oxidizing the surfaces of the columnar electrodes in order to form the copper oxide film, and so forth. Such increase in the number of processes inevitably leads to an increase in production costs.

In view of the above, it will be apparent to those skilled in the art from this disclosure that there exists a need for an improved semiconductor device and an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems and to provide a semiconductor device which has improved sealing characteristics, and which is therefore capable of preventing moisture from entering through gaps formed between each side of a conductive post and the sealing resin and thus improve its moisture resistance ability, and capable of preventing the conductive post from being displaced due to external force and thus improve its mechanical strength.

In accordance with a first aspect of the present invention, a semiconductor device comprises a semiconductor substrate, an electrode pad, a wiring, a conductive post, an insulator, a sealing resin, and an external electrode. The electrode pad is formed on the main surface of the semiconductor substrate. The wiring is formed above the semiconductor substrate, the wiring electrically connecting with the electrode pad. The conductive post is formed on the upper surface of the wiring, the conductive post electrically connecting with the wiring. The insulator is formed on the lateral surfaces of the conductive post and has a thermosetting property. The sealing resin is formed over the semiconductor substrate and the wiring, and on a surface of the insulator. The external electrode is formed on the conductive post, the external electrode electrically connecting with the conductive post.

In accordance with a second aspect of the present invention, a method of manufacturing a semiconductor device comprises the steps of: preparing a semiconductor substrate having an electrode pad on the surface; forming a wiring above the semiconductor substrate, the wiring electrically connecting with the electrode pad; forming a conductive post on the wiring, the conductive post electrically connecting with the wiring; forming a sealing resin over the semiconductor substrate and the wiring, the height of the upper face of the sealing resin being approximately the same as the height of the upper surface of the conductive post, and the sealing resin and the conductive post having a gap formed between them; forming an external electrode on the conductive post, the external electrode electrically connecting with the conductive post; filling a liquid material into the gap between the sealing resin and the conductive post, the liquid material having thermosetting and insulation properties; and forming an insulator on the lateral surfaces of the conductive post by causing the liquid material to harden by means of a thermal treatment.

In accordance with a third aspect of the present invention, the method of manufacturing a semiconductor device according to the second aspect is one in which the liquid material fills the gap as the liquid material is coated on the sealing resin, and a defoaming process is conducted on the semiconductor substrate.

In accordance with a fourth aspect of the present invention, the method of manufacturing a semiconductor device according to the third aspect is one in which the liquid material includes silicone.

In accordance with a fifth aspect of the present invention, the method of manufacturing a semiconductor device according to the second aspect further comprises the step of: removing the liquid material adhered to the sealing resin when filling the gap with the liquid material.

In accordance with a sixth aspect of the present invention, the method of manufacturing a semiconductor device according to the fifth aspect is one in which the liquid material includes silicone.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

First, a first embodiment of the present invention will be described in detail with reference to the drawings.

Figure 1:
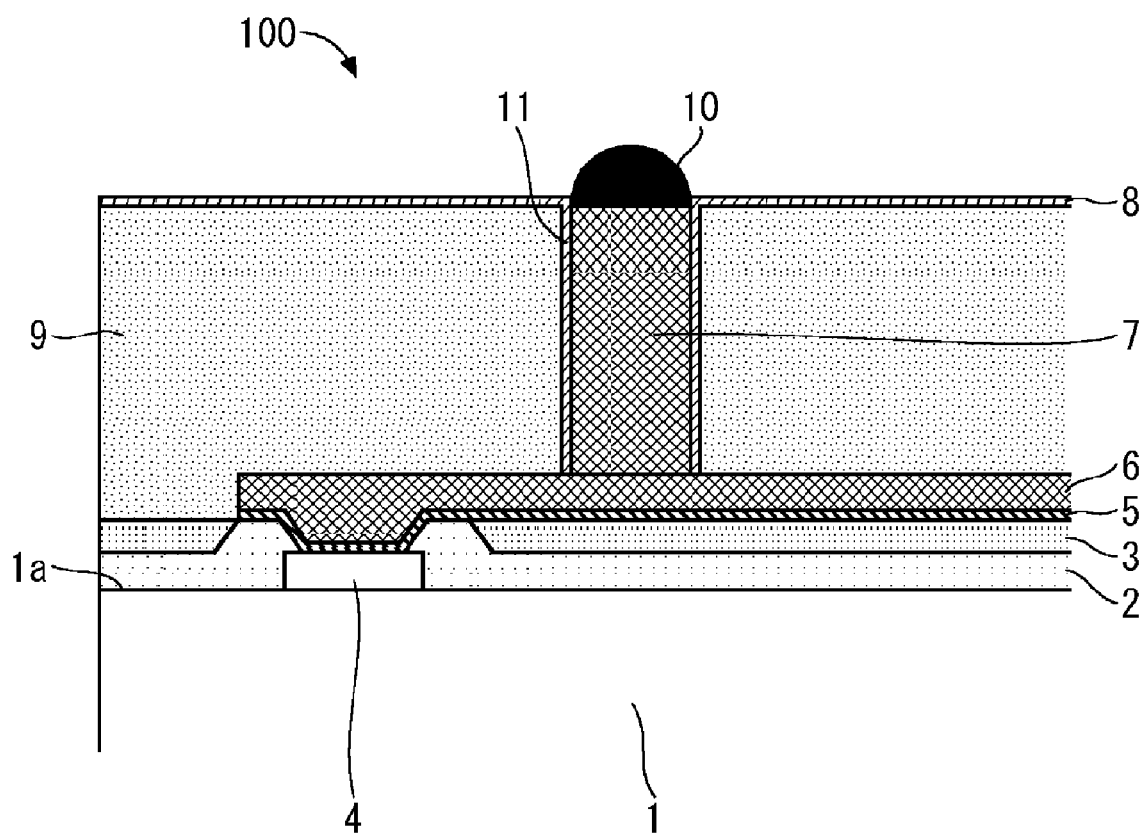
FIG. 1 is a diagram showing a cross sectional view of a portion of a semiconductor device according to a first embodiment of the present invention.

FIG. 1 is a diagram showing a cross sectional view of a portion of a semiconductor device 100 according to the first embodiment of the present invention. The semiconductor device 100 is a resin-sealed type semiconductor device manufactured by using a W-CSP technique, and includes a semiconductor substrate 1, protective films 2 and 3, electrode pads 4 (only one electrode pad 4 is shown in FIG. 1), conducting films 5 (only a portion of the conducting film 5 is shown in FIG. 1), wirings (also called re-wirings) 6 (only a portion of the wirings 6 are shown in FIG. 1), conductive posts 7 (only one conductive post 7 is shown in FIG. 1), an insulation film 8, a sealing resin 9, and external electrodes 10 (only one external electrode 10 is shown in FIG. 1).

The semiconductor substrate 1 has an electronic circuit (not shown) configured with one or more semiconductor elements such as transistors on an element forming surface 1a thereof. In addition, the semiconductor substrate 1 includes one or more inter-layer insulation films covering the semiconductor elements.

The semiconductor substrate 1 is made of silicon or the like. The protective film 2 is a passivation film for protecting the semiconductor substrate 1 from mechanical stress and impurities, and it is formed over the semiconductor substrate 1. The protective film 2 may be a silicon oxide film, a silicon nitride film, or the like. The electrode pads 4 serve to pass electrical signals between the semiconductor substrate 1 (i.e., the electronic circuit) and the exterior, and they are electrically connected to the semiconductor elements (not shown) formed on the element forming surface 1a.

The electrode pads 4 are made of aluminum (Al), copper (Cu), or the like. The protective film 3 is an insulation film having high heat resistance and high chemical resistance characteristics, and it is formed on the protective film 2 except the upper portions of the electrode pads 4. The protective film 3 is made of a polyimide resin or the like.

The conducting films 5 serve as foundation layers for forming the wirings 6, while they also serve as adhesive layers for improving adhesiveness between the electrode pads 4 in the lower layer and the wirings 6 in the upper layer, respectively. Each conducting film 5 is formed so as to connect with one or more electrode pads 4 and cover a portion of the protective film 3. Each conducting film 5 has a laminated structure that includes a Ti film formed in the lower layer and a Cu film formed in the upper layer, for instance.

The wirings 6 are metal wirings for connecting the electrode pads 4 and the conducive posts 7. Each wiring 6 is formed on each conducting film 5. Accordingly, Each wiring 6 lies over a portion of the protective film 3. The wirings 6 are made of Cu or the like.

The conductive posts 7 are columnar electrodes for respectively connecting the electrode pads 4 and the external electrodes 10 via the wirings 6, and they are formed on portions of the upper surfaces of the wirings 6. The conductive posts 7 are made of Cu or the like.

The insulation film 8 serves to fill up gaps 11 generated between the conductive posts 7 and the sealing resin 9, and is formed so as to cover the lateral surfaces of the conductive posts 7 and the surface of the sealing resin 9. The insulation film 8 is made of a thermosetting liquid material such as silicone, for instance.

The sealing resin 9 is a sealing material covering the protective film 3, the conducting films 5, the wirings 6, and the conductive posts 7 having the insulation film 8 formed on the lateral sides thereof. The upper surface of the sealing resin 9 is at approximately the same level as the upper surface of the conductive posts 7. The sealing resin 9 is made of a thermosetting resin such as an epoxy resin, for instance.

The external electrodes 10 are terminals for connecting the semiconductor device 100 to a mounting board such as a printed circuit board, for instance, and they are respectively formed so as to connect with top surfaces of the conductive posts 7. The external electrodes 10 are made of solder, for instance.

Now, a manufacturing method of the semiconductor device 100 according to the first embodiment of the present invention will be described. FIG. 2A to FIG. 3B are diagrams which simply illustrate manufacturing processes of the semiconductor device 100. Processes shown in FIG. 2A to FIG. 3B are done in a wafer state, since the sealing process in the W-CSP technique is to be done in a wafer state.

First, a semiconductor substrate 1 is prepared. Here, the semiconductor substrate 1 has had its electrical characteristic evaluated by a wafer inspection. In addition, the semiconductor substrate 1 has an electronic circuit (not shown), which is formed on an element forming surface 1a and configured with semiconductor elements such as transistors, and an interlayer insulation film, which is formed on the element forming surface 1a so that the element circuit is covered thereby.

Figure 2A:
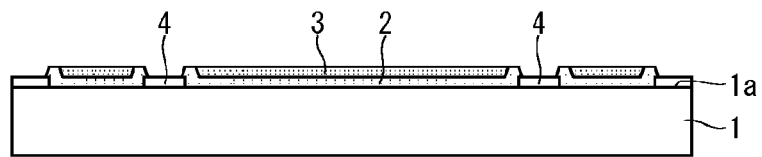
FIG. 2A to FIG. 3B are diagrams which simply illustrate manufacturing processes of the semiconductor device according to the first embodiment of the present invention.

Next, a protective film 2 and electrode pads 4 are formed on the element forming surface 1a, as shown in FIG. 2A. The electrode pads 4 are electrically connected with the semiconductor elements. The protective film 2 is formed on the surface of the semiconductor substrate 1 except the upper portions of the electrode pads 4. The protective film 2 is normally a silicon oxide film, but it may also be a silicon nitride film.

Next, a polyimide resin is applied to the entire surface of the semiconductor substrate 1, where the electrode pads 4 and the protective film 2 are formed, to a thickness of 4 to 10 μm (micrometers), and by conducting photolithographic and etching processes on the polyimide resin, a protective film 3 is formed on the protective film 2 except the upper portions of the electrode pads 4. As for the material of the protective film 3, it is also possible to use a benzocyclobutene (BCB) resin or the like instead of the polyimide resin.

Next, conducting films 5 are formed on portions of the protective film 3 by depositing Ti and Cu sequentially using a sputtering method, and then processing the deposited Ti and Cu films by conducting photolithographic and etching processes. The Ti film is 100 to 200 nm thick, for instance, and the Cu film is 200 to 700 nm thick, for instance. The Ti film constituting the lower layer of the conducting film 5 functions as an adhesive layer between the electrode pads 4 and wirings 6, and will be described in detail below. On the other hand, the Cu film constituting the upper layer of the conducting film 5 functions as a foundation layer in order to form the wiring 6. A commonly used material of the electrode pads 4 is Al, and a commonly used material of the wirings 6 is Cu.

Figure 2B:
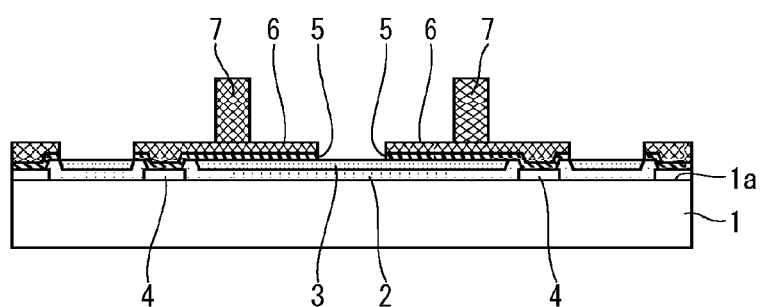

Next, using an electrolytic plating method, wirings 6 made of Cu are formed so as to laminate the conducting films 5 to a thickness of 2 to 10 μm, for instance. Then, using an electrolytic plating method, conductive posts 7 made of Cu are formed on portions of the upper surfaces of the wirings 6, as shown in FIG. 2B. Here the conductive posts 7 may be 50 to 100 μm in height and 100 to 400 μm in diameter, for instance. The plating process for forming the conductive posts 7 includes a process of forming a resist film over the entire surface, a process of forming openings in the resist film for exposing portions of the upper surfaces of the wirings 6, a process of soaking the semiconductor substrate 1 having the resist film with the openings in a Cu plating solution in order to fill the openings with the plating solution, and a process of removing the resist film after the plating solution is hardened.

Figure 2C:
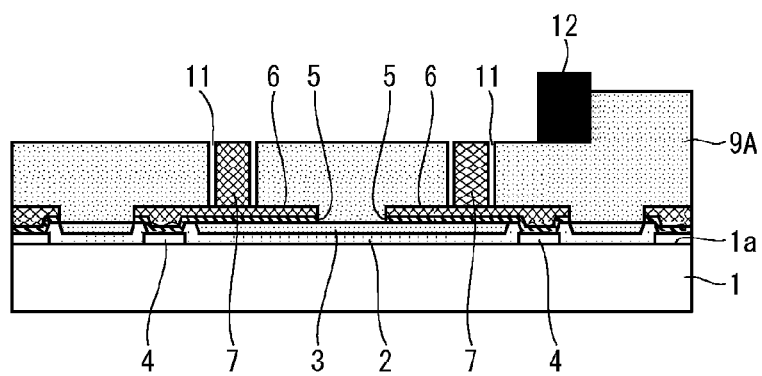

Next, a sealing resin 9A which is an epoxy resin is formed over the semiconductor substrate 1 so that the protective film 3, the conducting film 5, the wiring 6 and the conductive post 7 are sealed therewith. At this time, in order to have the sealing resin 9A cover the conductive posts 7 entirely, the sealing resin 9A is formed to be thicker than the height of the conductive posts 7, i.e., to be thicker than 50 to 100 μm. As for the material of the sealing resin 9A, it is also possible to use a phenol resin or the like instead of the epoxy resin. Then, by grinding the surface of the sealing resin 9A using a grinding stone 12 of a grinder (not shown), the surface of the sealing resin 9A is smoothed out and the surface of the conductive posts 7 is exposed, as shown in FIG. 2C. By this process, the sealing resin 9A is processed into a sealing resin 9. In forming the sealing resin 9A, there is a possibility that gaps 11 each of a few μ meters in width are generated between sides of the conductive posts 7 and the sealing resin 9, respectively, due to variations in manufacturing conditions, i.e. manufacturing error, external force at the time grinding and so forth. Here, the description will go on while assuming that the gap 11 is actually generated.

Figure 2D:
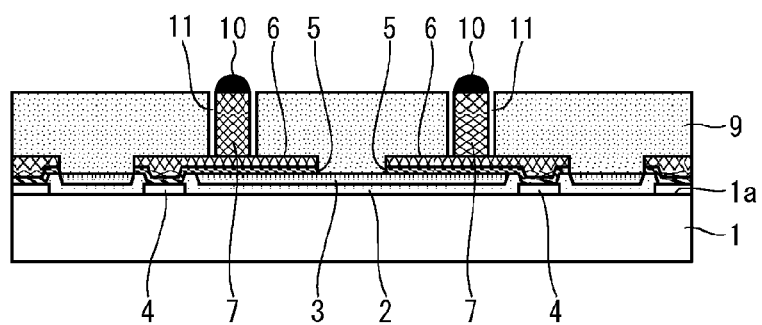

Next, external electrodes 10 made of solder are respectively formed on top surfaces of the conductive posts 7, as shown in FIG. 2D. The shape and forming method of each external electrode 10 will differ depending on the type of W-CSP technique employed. W-CSP technique types include the BGA type, LGA type, etc.

With the BGA type W-CSP technique, each external electrode 10 will be a pill electrode (i.e. a solder ball), and it may be formed by a ball mounting method, for instance. More specifically, solder balls are electrically mounted on the top surfaces of the conductive posts 7 by a ball mounter, and continuously reflowed to be formed into the external electrodes 10.

With the LGA type W-CSP technique, each external electrode 10 will be a thin electrode which is sufficiently thin for enabling the conductive post 7 and the mounting board to connect with each other, and it may be formed by a printing method. More specifically, creamy solder is printed on the top surfaces of the conductive posts 7 using a metal mask, and continuously reflowed in order to be formed into the external electrodes 10.

Figure 3A:
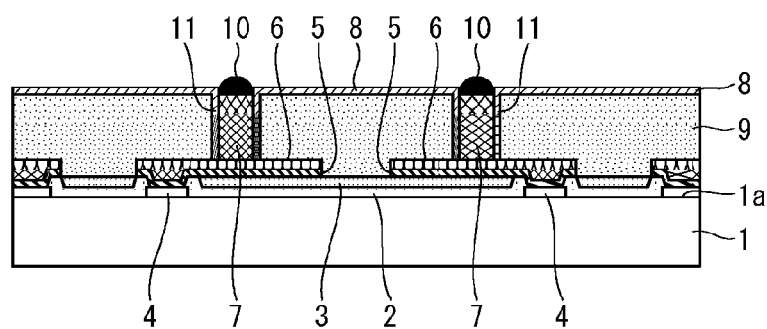

Next, an insulation film 8 made of silicone is formed inside the gaps 11 generated between the lateral surfaces of the conductive posts 7 and the sealing resin 9, and on the surface of the sealing resin 9, as shown in FIG. 3A. The process of forming the insulation film 8 includes the process of applying silicone on the surface of the sealing resin 9 evenly but in a way that does not cover the external electrode 10 by using an appropriate coating instrument such as an injection syringe, a process of conducting a defoaming process within a defoaming apparatus, the interior thereof maintained in a vacuum state, in order to draw out the air inside the gaps 11 and fill the gaps 11 with silicone, and a process of conducting a heat treatment at a temperature of 150° C. for 1 hour, for instance, in order to thermoset the silicone. Here, the material of the insulation film 8 is not limited to silicone, but any material is applicable as long as it is an insulation liquid material which can fill the gaps 11 and can be hardened by a heat treatment like silicone can.

Figure 3B:
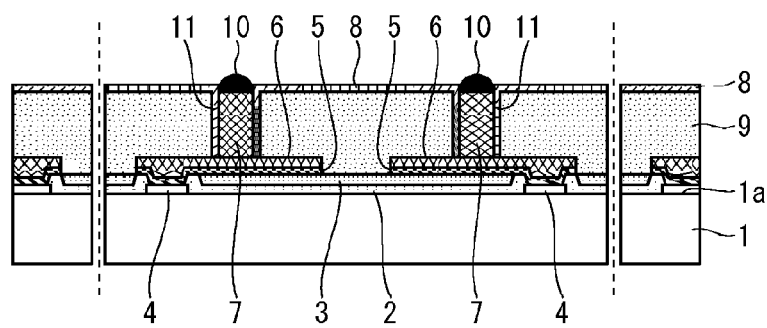

Next, the semiconductor substrate 1, on which a series of sealing processes has been completed, is cut into predetermined pieces by a dicing cutter, such as a diamond cutter or the like, to achieve the finished semiconductor device 100, as shown in FIG. 3B.

According to the first embodiment of the present invention, by having the gaps 11 generated between the conductive posts 7 and sealing resin 9 filled with the insulation film 8 (e.g., silicone), the semiconductor device 100 can achieve improved sealing characteristics. Therefore, in the semiconductor device 100 according to this embodiment, it is possible to prevent moisture from entering through the gaps 11 and thus achieve improved moisture resistance abilities, and it is possible to prevent the conductive posts 7 from being displaced due to external force and thus achieve improved mechanical strength.

Furthermore, according to this embodiment, since the gaps 11 are filled with a thermosetting liquid material such as silicone, the semiconductor device 100 can be manufactured through simple processes, and therefore, it is possible to reduce manufacturing costs.

Second Embodiment

Figure 4:
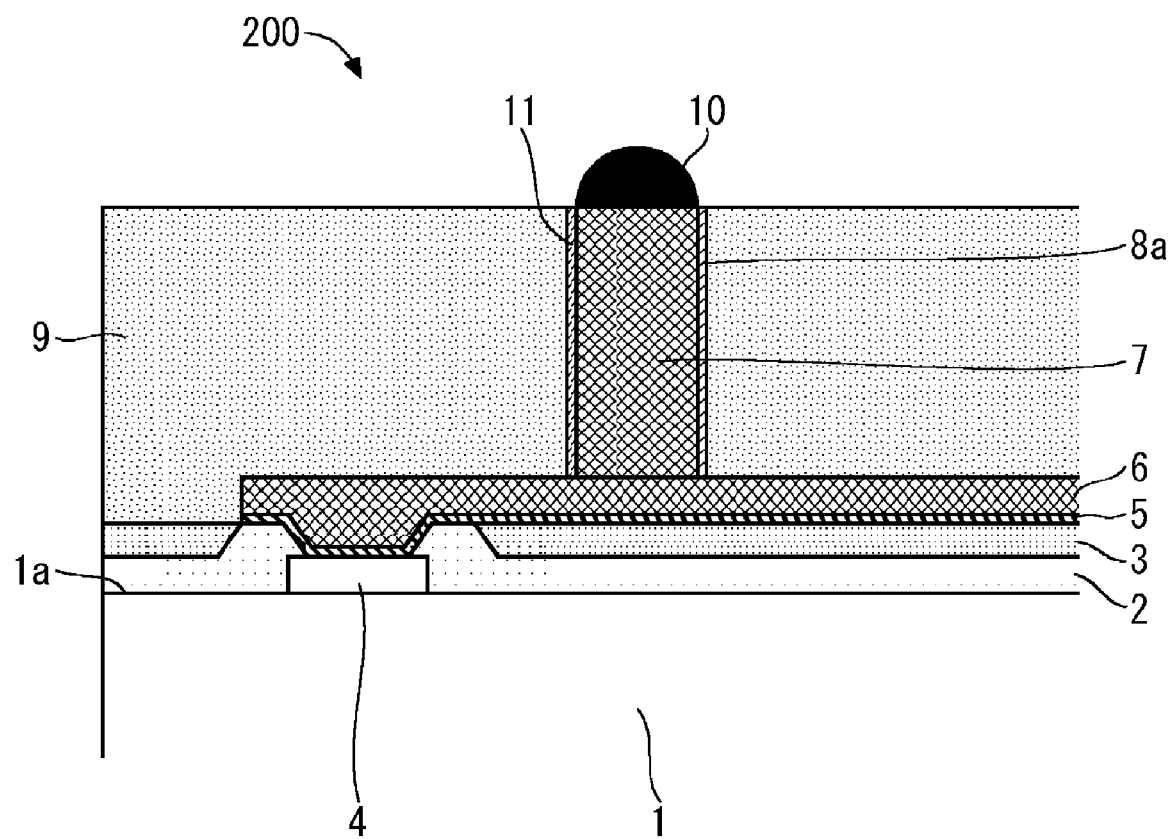
FIG. 4 is a diagram showing a cross sectional view of a semiconductor device according to a second embodiment of the present invention.

Next, a second embodiment of the present invention will be described in detail with reference to the drawings. FIG. 4 is a diagram showing a cross sectional view of a portion of a semiconductor device 200 according to the second embodiment of the present invention.

The semiconductor device 200 is a resin-sealed type semiconductor device manufactured by using a W-CSP technique, and it has the same structure as the semiconductor device 100 of the first embodiment (shown in FIG. 1), except that the insulation film 8 for filling the gaps 11 generated between the conductive posts 7 and the sealing resin 9 is replaced with insulation films 8a.

Since the rest of the structure is the same as the structure of the semiconductor device 100 of the first embodiment, the same reference numbers will be used for the structural elements that are the same as the first embodiment, and redundant explanation of those structure elements will be omitted.

The insulation films 8a serve to fill the gaps 11 generated between the conductive posts 7 and the sealing resin 9 as with the insulation film 8 of the first embodiment, and they are formed so as to cover only the lateral surfaces of the conductive posts 7. The insulation films 8a are made of a thermosetting liquid material such as silicone, for instance.

Now, a manufacturing method of the semiconductor device 200 according to the second embodiment of the present invention will be described. The manufacturing method of the semiconductor device 200 of this embodiment has the same processes as the manufacturing method of the semiconductor device 100 in the first embodiment (shown in FIG. 2A to FIG. 3B), except for the processes of forming the insulation films 8a (shown in FIG. 3A). Therefore, in this embodiment, the same processes ranging from the process of preparing the semiconductor substrate 1 to the process of forming the external electrodes 10 on the top surfaces of the conductive posts 7 in the first embodiment (shown in FIG. 2A to FIG. 2D) will be referred to, but redundant explanations of those processes will be omitted, and in the following, the processes to be conducted after the external electrodes 10 are formed on the top surfaces of the conductive posts 7 (shown in FIG. 2D) will be described.

Figure 5A:
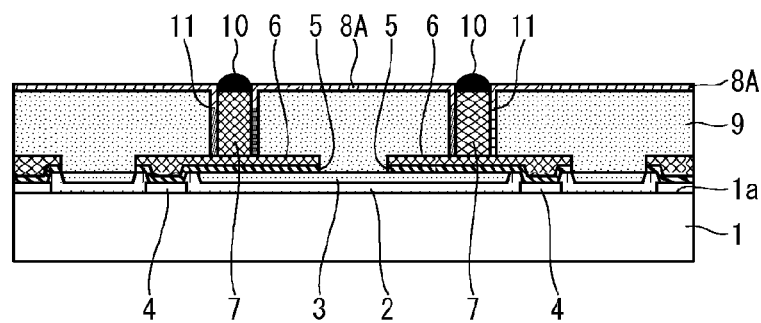
FIG. 5A to FIG. 5C are diagrams which simply illustrate manufacturing processes of the semiconductor device according to the second embodiment of the present invention.

After forming the external electrodes 10 on the top surfaces of the conductive posts 7, an insulation film 8A made of silicone is formed inside the gaps 11 generated between the conductive posts 7 and the sealing resin 9, and on the top surface of the sealing resin 9, as shown in FIG. 5A. The process of forming the insulation film 8A includes the process of applying silicone on the top surface of the sealing resin 9 evenly but so as not to cover the external electrode 10 by using an appropriate coating instrument such as an injection syringe, a process of conducting a defoaming process within a defoaming apparatus, of which the interior thereof is maintained in a vacuum state, in order to draw out air inside the gaps 11 and fill the gaps 11 with silicone. Here, the material of the insulation film 8A is not limited to silicone, but any material is applicable as long as it is an insulation liquid material which can fill the gaps 11 and can be hardened by a heat treatment like silicone can.

Figure 5B:
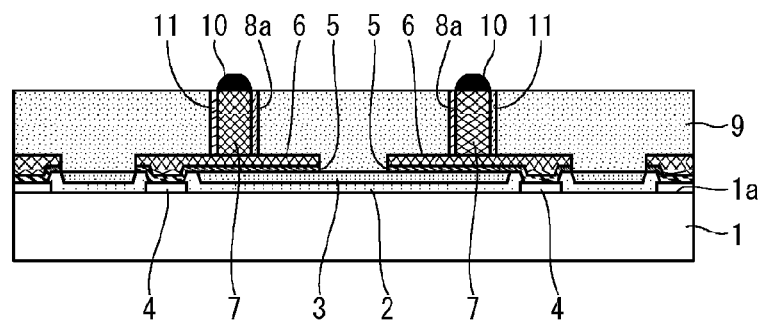

Next, the insulation film 8A (i.e., silicone for instance) on the top surface of sealing resin 9 is removed by a wipe away process, a mop-up process, or the like, after which a heat treatment is conducted at a temperature of 150° C. for 1 hour, for instance, in order to thermoset the silicone. By these processes, the insulation films 8a will be formed only on the lateral surfaces of the conductive posts 7, as shown in FIG. 5B.

Figure 5C:
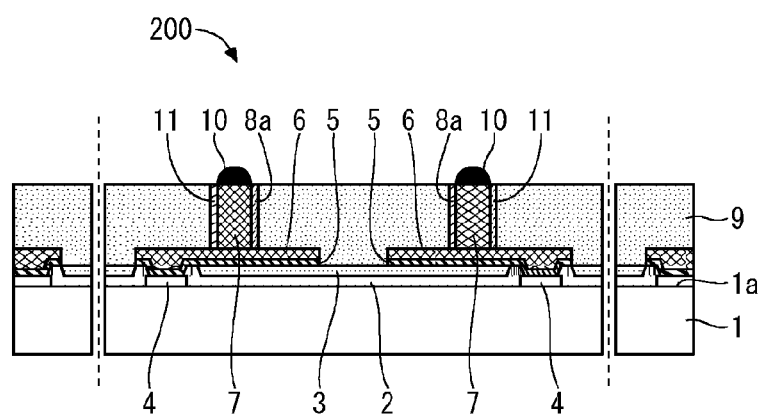

Next, the semiconductor substrate 1, on which a series of sealing processes have been completed, is cut into predetermined pieces by a dicing cutter, such as a diamond cutter or the like, to achieve the finished semiconductor device 200, as shown in FIG. 5C.

According to the second embodiment of the present invention, by having the gaps 11 generated between the conductive posts 7 and sealing resin 9 filled with the insulation films 8a (e.g. silicone), the semiconductor device 200 can achieve improved sealing characteristics. Therefore, in the semiconductor device 200 according to this embodiment, it is possible to prevent moisture from entering through the gaps 11 and thus achieve improved moisture resistance abilities, and it is possible to prevent the conductive posts 7 from being displaced due to external force and thus achieve an improved mechanical strength.

Furthermore, according to this embodiment, since the gaps 11 are filled with a thermosetting liquid material such as silicone, the semiconductor device 200 can be manufactured through simple processes, and therefore, it is possible to reduce the manufacturing costs.

Moreover, according to this embodiment, since the lateral sides of the external electrodes 10 are made to be exposed completely by removing the liquid material, such as silicone, on the upper surface of the sealing resin 9, it is possible to improve the connection reliability between the semiconductor device 200 and a mounting board.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-117956. The entire disclosures of Japanese Patent Application No. 2005-117956 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A semiconductor device, comprising:
   a semiconductor substrate having an electronic circuit provided on a main surface thereof;
   an electrode pad formed on the main surface of the semiconductor substrate;
   a wiring formed above the semiconductor substrate, the wiring electrically connecting with the electrode pad;
   a conductive post formed on the upper surface of the wiring, the conductive post electrically connecting with the wiring;
   an insulator formed on the lateral sides of the conductive post, the insulator comprising a thermosetting material;
   a sealing resin layer formed over the semiconductor substrate and the wiring, and on a surface of the insulator so that the insulator is sandwiched between the sealing resin layer and the conductive post; and
   an external electrode formed on the conductive post, the external electrode electrically connecting with the conductive post.

2. The semiconductor device according to claim 1, wherein the insulator is composed of silicone.

3. The semiconductor device according to claim 1, wherein the insulator extends to the upper surface of the sealing resin layer.

4. The semiconductor device according to claim 3, wherein the insulator is composed of silicone.

5. A semiconductor device, comprising:
   a semiconductor substrate having an electronic circuit provided on a main surface thereof;
   an electrode pad formed on the main surface of the semiconductor substrate;
   a wiring formed above the semiconductor substrate, the wiring electrically connecting with the electrode pad;
   a conductive post formed on the upper surface of the wiring, the conductive post electrically connecting with the wiring and having a top surface and lateral sides;
   a sealing resin layer formed over the semiconductor substrate, the wiring, and the conductive post, and smoothed to expose the top surface of the conductive post whereby gaps. are created between the sealing resin layer and the lateral sides of the conductive post during smoothing;
   an insulation layer formed in the gaps between the sealing resin layer and the lateral sides of the conductive post so that the insulation layer is sandwiched between the sealing resin layer and the conductive post, the insulation layer comprising a thermosetting material; and
   an external electrode formed on the top surface of the conductive post, the external electrode electrically connecting with the conductive post.

6. The semiconductor device according to claim 5, wherein the insulation layer is additionally formed on the top surface of the sealing resin layer.

7. The semiconductor device according to claim 5, wherein the insulation layer is composed of silicone which is provided in the gaps as a thermosetting liquid and heated.

* * * * *